United States Patent [19]

Shibata et al.

[11] Patent Number: 4,850,038
[45] Date of Patent: Jul. 18, 1989

[54] FREQUENCY CONVERTER

[75] Inventors: Fumiaki Shibata; Masayuki Matsutake, both of Fukaya, Japan

[73] Assignee: Kabushiki Kaisha Toshiba, Kanagawa, Japan

[21] Appl. No.: 886,075

[22] Filed: Jul. 16, 1986

[30] Foreign Application Priority Data

Jul. 18, 1985 [JP] Japan .................................. 60-156958

[51] Int. Cl.[4] .............................................. H04B 1/26
[52] U.S. Cl. .................... 455/315; 455/239; 455/241; 455/253; 455/311
[58] Field of Search ............... 455/314, 315, 316, 234, 455/241, 247, 251, 239, 253, 240, 246, 295, 296, 308, 311; 375/98; 330/277–279, 285

[56] References Cited

U.S. PATENT DOCUMENTS

| | | | |
|---|---|---|---|
| 1,905,946 | 4/1933 | Mathieu et al. | 455/251 |
| 3,454,721 | 7/1969 | Wolff | 455/251 |
| 4,222,118 | 9/1980 | Dickinson et al. | 455/247 |
| 4,353,132 | 10/1982 | Saitoh et al. | 455/315 |
| 4,455,681 | 6/1984 | Wile | 455/253 |
| 4,509,207 | 4/1985 | Tong et al. | 455/253 |
| 4,545,072 | 10/1985 | Skutta et al. | 455/315 |
| 4,590,613 | 5/1986 | Tannery, IV | 455/253 |
| 4,704,738 | 11/1987 | Graziadei et al. | 455/253 |

FOREIGN PATENT DOCUMENTS

| | | |
|---|---|---|
| 961131 | 1/1969 | United Kingdom . |
| 1330988 | 1/1970 | United Kingdom . |
| 840976 | 5/1970 | United Kingdom . |
| 1227263 | 6/1974 | United Kingdom . |
| 1226408 | 3/1980 | United Kingdom . |
| 500828 | 9/1982 | United Kingdom . |
| 443270 | 7/1983 | United Kingdom . |
| 1533719 | 10/1985 | United Kingdom . |

Primary Examiner—Robert L. Griffin
Assistant Examiner—Curtis Kuntz
Attorney, Agent, or Firm—Finnegan, Henderson, Farabow, Garrett, & Dunner

[57] ABSTRACT

A frequency converter suitable for a multi-channel broadcast signals receiver is provided. The frequency converter includes a pre-amplifier with an AGC control terminal, first and second local oscillators, a first mixer for converting a first-RF frequency of the broadcast signal to a second-RF frequency using a first oscillation signal output from the first local oscillator, a second-RF signal amplifier with an AGC control terminal for amplifying the second-RF signal, a second mixer for converting the second-RF frequency of the second-RF signal output from the second-RF signal amplifier to a third-RF frequency using a second local oscillation signal output from the second local oscillator, and an AGC circuit for feeding back to the pre-amplifier and the second-RF signal amplifier the AGC signal which is obtained from the third-RF frequency signal as a conversion output from the second mixer for simultaneously controlling the gains of both the preamplifier and the second-RF signal amplifier.

16 Claims, 5 Drawing Sheets

FREQUENCY CONVERTER

BACKGROUND OF THE INVENTION

1. Field of the Invention

This invention relates to a frequency converter, and more particularly, to a frequency converter suitable for a multi-channel broadcast signal receiver.

2. Description of the Prior Art

Generally, the basic function of a frequency converter is to convert frequencies of received broadcast signals into prescribed frequencies. In this frequency conversion operation, although it is necessary to take a sufficient signal-to-noise ratio (S/N) into account to obtain the required power gain, the frequency conversion operation must be performed so that a prescribed selectivity can be maintained. Also, to avoid signal distortion, such as cross-modulation distortion, the gain of the frequency converter must be controlled. However, it has been difficult to eliminate the signal distortion and improve the S/N simultaneously since an improvement in one results in a degradation of the other. Therefore, the prior art faces a problem of how to suppress the signal distortion and prevent a simultaneous deterioration of the S/N of the frequency converter.

Apart from receivers for conventional television broadcasting, this problem also affects receivers for CATV broadcasting, which is a multi-channel broadcasting with many transmission channels.

In a CATV converter which functions as a tuner-converter for a CATV receiver, channel frequencies, i.e., first-RF signal frequencies of received CATV broadcast signals, are first converted into corresponding second-RF signal frequencies which are higher than the first-RF signal frequencies of the received CATV broadcast signals by a first mixer (up conversion) and then selected by a second-RF tuned amplifier and converted into a prescribed television channel frequency representing a vacant channel (non-broadcast channel) among a general television broadcast channel band, e.g., the VHF band, or the UHF band by a second mixer (down conversion). This type of frequency converter is known as an up-down frequency converter because it first converts the first-RF signal frequency into the second-RF frequency which is higher than the first-RF signal frequency and then converts the second-RF frequency into the prescribed television channel frequency which is lower than the first-RF signal frequency.

The frequency conversion as described above is carried out on the respective multiple CATV broadcast signals, while the received CATV broadcast signals or the first-RF signals are transmitted through a coaxial cable and applied to the frequency converter. Levels or intensities of individual channel signals of the CATV broadcast channels band are not always the same. Therefore, a tilt amplification characteristic can be employed at a line repeater which is provided in a transmission line for a reception terminal, i.e., the frequency converter, to make its gain vary for the lower and higher transmission channel frequencies. The tilt amplification characteristic of the line repeater is determined by responding to level diviations among channels in the reception terminal, signal distortion in the transmission system, etc. That is to say, the transmission characteristics of the tilt amplification characteristic of the line repeater should be determined by taking into account the signal distortion and the S/N of frequency converter in the reception terminal.

FIG. 6 shows a circuit of a conventional up-down frequency converter. In the Figure, a plurality of CATV broadcast channel signals are applied to an input terminal 1. Then plurality of CATV broadcast channel signals are inputted to a first mixer 4 via a band pass filter (BPF) which comprises of a high pass filter (HPF) 2 and a low pass filter (LPF) 3. First mixer 4 also has applied an output of a first local oscillator 6 via an amplifier 5. The frequencies of the input CATV broadcast signals are raised in first mixer 4, respectively, to frequencies each higher by a first oscillation frequency of first local oscillator 6. The frequency-converted signals, i.e., second-RF signals from first mixer 4 are input to second mixer 10 via a first frequency gate which comprises a BPF 7, a second-RF signal amplifier 8 and a BPF 9. The first frequency gate passes through it a signal with a prescribed second-RF frequency of the second-RF signals to second mixer 10. Second mixer 10 receives the output of a second local oscillator 11. Second mixer 10 lowers the prescribed second-RF frequency of the signal that passed through the first frequency gate to a prescribed frequency which corresponds to a vacant channel (non-broadcast channel) among the afore-mentioned conventional television broadcast channel band, e.g., the VHF band or the UHF band, in using the oscillation output of second local oscillator 11. The frequency-converted signal is output from output terminal 13 via output BPF 12.

As described above, it is generally desirable that the frequency converter should not deteriorate its noise figure (NF) characteristics and should suppress any signal distortion occuring therein.

When a non-linear signal distortion occus in an amplifier, generally there is a following relationship between an input signal voltage and an output voltage of the amplifier.

$$Ye = \sum_{n=1}^{m} Kn \cdot e^n \qquad (1)$$

wherein,

Ye: Output signal voltage of amplifier
e: Input signal voltage of amplifier
Kn: Coefficient presenting a linearity of amplification the amplifier
n: Order of signal distortion Although the non-linear signal distortion occurs to fairly high orders as seen from Equation (1), only the second order distortion component (n=2) and the third order distortion component (n=3) need to be considered for practical use. When the amount of the signal distortion given by Equation (1) rises in an amplifier costituting the frequency converter, a cross-modulation disturbance and a beat disturbance occur. The degree of the cross-modulation disturbance is proportional to the square of the amplitude of the signal which interferes with the desired signal. Moreover, the cross-modulation disturbance becomes greater as number of the received broadcast channel signals increases.

On the other hand, the beat disturbance occurs when signal distortions occurring for a plurality of the received broadcast channel signals are present in the television broadcast channel band. For reducing the effects of the cross-modulation distortion and the beat disturbance, pre-amplifier 14 could be removed from the circuit arrangement shown in FIG. 6. However, then the carrier-to-noise ratio (C/N) at the frequency converter worsens due to the lack of the pre-amplifier.

The C/N is generally expressed by $$C/N[dB] = e_i[dB\ u] - NF[dB] - 0.8[dB] \quad (2)$$

Also, a total amount of the C/N is given as follows, $$C/Nm[dB] = C/N[dB] - 10\ \log_{10} m[dB] \quad (3)$$

wherein m represents the number of amplifier stages connected in cascade. As seen from Equation (3), the total amount of the C/N, i.e., the C/Nm, is inversely proportional to the number of amplifier stages in cascade; m. In other words, when m number of amplifier stages of the same performance are connected in cascade, the C/N of the frequency converter wersons by $10\ \log_{10} m[dB]$. Therefore, when m number of amplifier stages are connected in cascade, each amplifier stage requires for its input signal a level of $e_i$, given in the following Equation (4), in order to maintain the C/N value the same as when only one amplifier stage is used.

$$e_i[dB\ u] = e_{min}[dB\ u] + 10\ \log_{10} m \quad (4)$$

wherein $e_{min}$ represents the lowest signal input level which is obtained using Equation (2).

It is clear from Equation (4) that, in order to obtain the C/N over a prescribed value, the input signal is required to be at a sufficient level over a prescribed level.

Therefore, the input signal level for the frequency converter must be set to an optimum level 30 to satisfy both requirements of 10W signal distortions and high C/N.

In the conventional frequency converter shown in FIG. 6, since no pre-amplifier is provided prior to first mixer 4, although a lower processed signal level is desirable for reducing the signal distortion, the C/N is deteriorated since the input signal level is insufficient to satisfy the prescribed C/N required in the rear stage amplifier, e.g., second-RF amplifier 8.

For resolving the problem, a pre-amplifier is provided prior to the first mixer, for example, in a position between HPF 2 and LPF 3 which are shown in the FIG. 6. This pre-amplifier is employed at the cost of increasing the signal distortion, such as the cross-modulation distortion. FIG. 7 is a circuit diagram showing the construction of this type of circuit, and it differs from the circuit in FIG. 6 in that amplifier 14 is provided. Amplifier 14 is generally called a pre-amplifier. It is provided for preventing the deterioration of the C/N of the frequency converter.

In the frequency converter shown in FIG. 7, pre-amplifier 14 amplifies the input signal to a required level, given by Equation (4) and contributes to the obtaining of the prescribed C/N. On the other hand, the second and the third order distortions are increased.

That is to say, although the C/N is improved, cross-modulation distortion will occur if there is non-linear distortion in pre-amplifier 14. Thus it is necessary to control the gain of pre-amplifier 14 so that the signal distortion is not increased by excessive gain.

When an m number of amplifier stages are connected in cascade, if power gains of the respective amplifier stages are taken as $G_1, G_2, \ldots G_m$ and the NFs of the respective amplifier stages are taken as $NF_1, NF_2, \ldots NF_m$, the total niose figure $NF_t$ is expressed by $$NF_t = NF_1 + \frac{NF_2 - 1}{G_1} + \frac{NF_3 - 1}{G_1 \cdot G_2} + \ldots + \frac{NF_m - 1}{G_1 \cdot G_2 \ldots G_m - 1} \quad (5)$$

Thus for improving the NF and the C/N, it is advantageous to heighten the gain of the amplifiers in the rear stages of the frequency converter. On the other hand, for suppressing the signal distortion, it is desriable to heighten the gain of the amplifiers in the front stages of of the frequency converter. Therefore, with respect to the gains of the amplifiers, the NF or the C/N characterstic of its frequency converter and the signal distortion characterstic have responses inconsistent with each other.

In the conventional frequency converter as shown in FIG. 7, either pre-amplifier 14 or second-RF amplifier 8 is made so that its gain may be controlled automatically in response to the output of the frequency converter. That is, an automatic gain control (AGC) is performed in one of pre-amplifier 14 or second-RF amplifier 8.

If the AGC is carried out in second-RF amplifier 8, a sufficient level of the input signal must be maintained over the level which satisfies Equation (4), so that the C/N will not be excessively deteriorated. However, signal distortion becomes severe when the level of the input signal exceeds a predetermined level in conjunction with the AGC. This is because the AGC is carried out for the signal from first mixer 4, in which the signal distortion has occured due to non-linear characteristic elements of first mixer 4 for effecting the frequency conversion.

Moreover, in the case when the AGC is carried out in pre-amplifier 14, there is a limit to the extent of gain reduction (GR) due to the AGC, because pre-amplifier 14 is, for example, a 55–450 MHz broad band amplifier. Thus the GR for pre-amplifier 14 can not be expected to sufficiently suppress the signal distortion.

Thus, in the conventional frequency converters shown in FIGS. 6 and 7, since both the C/N characteristic and the distortion characteristic are prescribed, recently there has been a problem in that it is difficult to control the signal gain for those levels.

SUMMARY OF THE INVENTION

An object of the present invention is to provide a frequency converter which can control the signal level at an optimum value suitable for both the C/N characteristic and the signal distortion characteristic.

These and other objects are achieved in a frequency converter which includes an input terminal for receiving a broadcast signal with a first frequency, a first variable gain amplifier for amplifying the broadcast signal applied from the input terminal, a local oscillator for generating a local oscillation signal, a frequency mixer circuit for converting the broadcast signal applied from the first amplifier to a second frequency using the local oscillation signal output from the local oscillator, a second variable gain amplifier for amplifying a signal with the second frequency applied from the frequency mixer circuit and an AGC circuit means for feeding back to the first and second variable gain amplifiers an AGC signal which is obtained from a signal output from the second variable gain amplifier.

Additional objects, advantages and features of the present invention will become apparent to persons skilled in the art from a study of the following description and of the accompanying drawings, in which:

DESCRIPTION OF THE PREFERRED EMBODIMENTS

The present invention will now be described in detail with reference to the accompanying drawings, namely, FIGS. 1 to 5.

Figure 1:
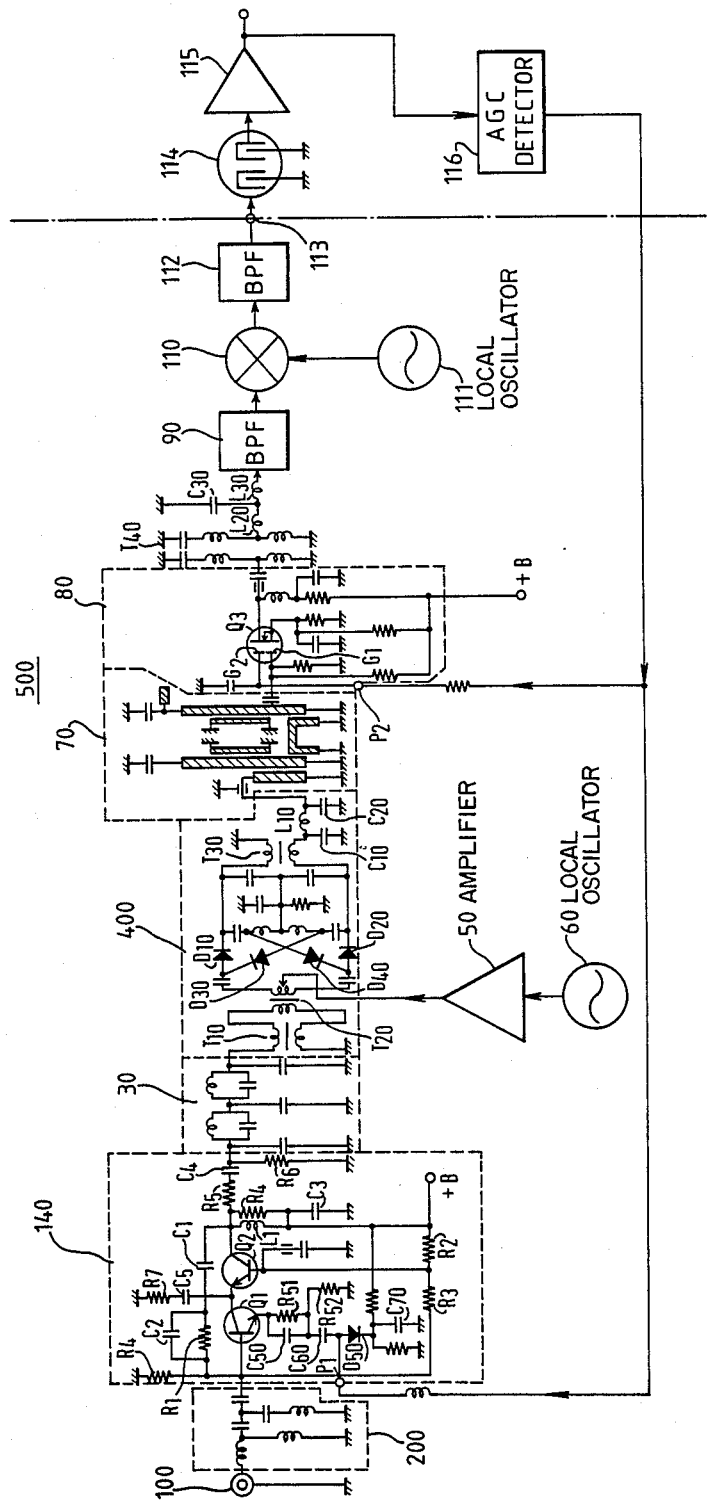
FIG. 1 is a circuit diagram showing an embodiment of the frequency converter according to the present invention.

Referring now to FIG. 1, there is shown the circuit diagram of a frequency converter according to the present invention. The circuit diagram shows an example of a circuit which carries out the AGC for an up-down frequency converter which receives multi-channel broadcast signals, for example, CATV broadcast signals.

In FIG. 1, a plurality of broadcast signals, e.g., the CATV broadcast channel signals are input to an input terminal 100. Then the plurality of CATV broadcast channel signals are applied from input terminal 100 to a first mixer 400 via a first signal transmission circuit. The first signal transmission circuit comprises of an HPF 200, a pre-amplifier 140 and a LPF 300. First mixer 400 also receives an oscillation output of a first local oscillator 60 via an amplifier 50. The input CATV broadcast channel signals have their frequencies raised in first mixer 400, respectively, to frequencies each higher by the first local oscillation output of first local oscillator 60. The frequency-converted signals, i.e., second-RF signals, from first mixer 400 are input to a second mixer 110 via a second-RF signal tunner circuit 500 which comprises a BPF 70, a second-RF signal amplifier 80 and a BPF 90. The second-RF signal amplifier 500 passes through it a signal with a prescribed second-RF frequency of the second-RF signals to second mixer 110. Second mixer 110 is supplied with an oscillation output of a second local oscillator 111. Second mixer 110 lowers the prescribed second-RF frequency of the signal that passed through second-RF signal amplifier 500 to a prescribed frequency which corresponds to a vacant channel (non-broadcast channel) of the aforementioned conventional television broadcast channel band, e.g., the VHF band or the UHF band, in using the oscillation output of second local oscillator 111. The frequency-converted signal is output from output terminal 113 via an output BPF 112.

In amplifier 140, transistors Q1 and Q2 are connected in cascade. Transistor Q1 is connected in a grounded-emitter configuration amplifier, while transistor Q2 is connected in a grounded-base configuration amplifier. An output circuit of the amplifier of transistor Q1 is connected to an input circuit of the amplifier of transistor Q2 so that an input capacitance of the amplifier of transistor Q2 is reduced. This makes the amplification characteristic of the cascade connected amplifier flat over a broad band. The broad band amplification is enhanced by feeding back an output of transistor Q2 to the input circuit of Q1 via a feedback circuit composed of capacitors C1 and C2 and a resistor R1. The feedback operation carries out a broad band compensation. A series circuit composed of a capacitor C5 and the resistor R7 is connected between a collector of transistor Q1 and a ground for preventing an undesired oscillation in the cascade connection amplifier. Moreover, base bias voltages for transistors Q1 and Q2 are applied by dividing a power supply voltage +B with a series circuit of resistors R2, R3 and R4 connected between a power supply terminal and the ground potential circuit. For the collector of transistor Q2, the bias voltage is applied via a choke coil L1 which prevents undesired high-frequency signals from getting into the bias circuit. The undesired high-frequency signals are by-passed via a capacitor C3 connected between the bias circuit and the ground potential circuit.

The output of pre-amplifier 140 composed of the cascade amplifier of transistors Q1 and Q2 is applied to first mixer 400 via LPF 300 after its DC current component has been eliminated by a coupling capacitor C4 connected in series with the output circuit of the grounded-base configuration amplifier of transistor Q2.

Resistors R4, R5 and R6, which are connected to the output side of pre-amplifier 140, essentially compose a π (pi)-network attenuator for an AC signal and contribute to suppress the signal distortion that would occur in following stage first mixer 400 due to non-linear characteristic elements for a frequency conversion at first mixer 400. The suppression of the signal distortion is further ensured by means of following stage LPF 300, which prevents the undesired high-frequency signal from getting into first mixer 400.

In addition, pre-amplifier 140 has an AGC terminal P1 for receiving an AGC signal, which will be explained in detail later.

The frequency conversion at first mixer 400 is effected by an addition of the broadcast signal (first-RF signal) and the first local oscillation signal at a diode bridge composed of diodes D10, D20, D30 and D40. The first-RF signals are applied to the diode bridge through transformers T10 and T20 which are connected in series with an input circuit of first mixer 400. The first local oscillation signal is applied to the diode bridge through a tap of a secondary winding of transformer T20. The second-RF signals thus converted by the diode bridge are output through a BPF composed of a transformer T30, an inductor L10, and capacitors C10 and C20 in first mixer 400. The second-RF signals output from first mixer 400 are applied to second-RF tuner circuit 500 composed of BPF 70, second-RF signal amplifier 80 and BPF 90 as described above.

Second-RF tuner circuit 500 has a prescribed tuning frequency, i.e., a prescribed second-Rf signal frequency, which corresponds to a desired CATV broadcast channel frequency so that only the prescribed second-RF signal is effectively transmitted therethrough. BPF 70 is a λ/4 type composition with a steep band pass filtering characteristic. Therefore, BPF 70 selects a signal having the tuning frequency, i.e., the prescribed second-RF signal frequency among the plurality of the second-RF signals from first mixer 400. The prescribed second-RF signal thus selected is amplified in second-RF signal amplifier 80. The selection of the prescribed second-RF signal is most effected by BPF 90.

Second-RF signal amplifier 80 is composed of an FET Q3 in order to suppress the third order distortion. The signal, i.e., the prescribed second-RF signal applied thereto, has been amplified in pre-amplifier 140 to the level such that the C/N of the signal is not deteriorated as expressed in Equation (4). Moreover, second-RF signal amplifier 80 has an AGC terminal P2 for receiving the AGC signal. That is, FET Q3 receives the AGC signal at its second gate G2 so that the gain of second-RF signal amplifier 80 is controlled. The gain reduction (GR) in second-RF signal amplifier 80 due to the AGC is made greater than the GR in pre-amplifier 140 for improving the NF and the C/N in the frequency converter. This is because a greater GR in the second stage amplifier is advantegeous for improving the NF and the C/N when compared to the GR in the first stage amplifier, as afore-mentioned and seen from Equation (5). Moreover, the greater GR in second-RF signal amplifier 80 is necessary for suppressing the cross-modulation distortion which would occur at another frequency conversion in the second mixer 110.

The gain-controlled output signal from second-RF signal amplifier 80 is input to BPF 90 via a filter composed of a transformer T40, which is of also a λ/4 type composition with a steep band pass filtering characteristic due to inductive coupling, and then via an impedance matching circuit composed of inductors L20 and L30 and a capacitor C30. The prescribed second-RF frequency signal from second-RF signal amplifier 80 has the undesired frequency components further reduced by the filter composed of transformer T40 and BPF 90, so that the selectivity for the prescribed second-RF frequency signal is sufficiently raised.

In second mixer 110, the prescribed second-RF frequency signal is lowered in frequency to the prescribed frequency which corresponds to the prescribed channel of the conventional television broadcast channel as mentioned above, in using the second local oscillation output of second local oscillator 111. The prescribed television channel frequency signal thus converted is applied to a television receiver through output terminal 113 of the frequency converter. In the television receiver, the prescribed television channel frequency signal from the frequency converter is again lowered in frequency to an intermediate frequency (IF) in the normal manner. The IF signal is applied to an AGC signal detection circuit 116 through a surface wave filter 114 and an IF signal amplifier 115. Surface wave filter 114 rises the selectivity for the prescribed IF signal by its steep band pass filtering characteristic, while IF signal amplifier 115 amplifies the IF signal.

In AGC detection circuit 116, an AGC signal is detected from the IF signal by well-known technique, for example, a peak detection which detects signal peaks. The AGC signal thus detected is supplied simulteneously to AGC terminals P1 and P2 of pre-amplifier 140 and second-RF signal amplifier 80 so that an AGC loop is formed.

The AGC in the frequency converter shown in FIG. 1 will be now explained in detail. The frequency conversion is carried out by means of a heterodyne operation in first mixer 400. For suppressing the signal distortion which occurs due to non-linear characteristic elements for the frequency conversion, the diode bridge comprised of diodes D10, D20, D30 and D40 is, for example, employed in first mixer 400 as described above. However, the frequency conversion is accompanied by a conversion loss, so that the signal to be supplied to second-RF signal amplifier circuit 80 becomes insufficient to prevent the C/N from being severely deteriorated.

Therefore, pre-amplifier 140 is provided in front of first mixer 400 in order to make the C/N no worse than the C/N of the received signal on input terminal 100. However, if the gain of amplifier 140 exceeds a predetermined value, the signal distortion as obtained by Equation (1) will increase over a predetermined value due to the non-linearity of amplifier 140 itself.

As is well-known, the non-linearity of the amplifier itself gives rise to undesired high-frequency signals, cross-modulation distortion signals etc. The undesired high-frequency signals, cross-modulation distortion signals etc. then interfere with the desired signal. The non-linear distortion creates a serious problem when there are a plurality of broadcast channels such as the conventional television broadcast channel waves or the CATV broadcast channel waves.

Therefore, it is necessary for the gain of pre-amplifier 140 to be controlled to a degree such that the non-linear distortion is below an acceptable low level, and also to have the gain such that the C/N will not be badly deteriorated in processing the signals in the following stage. For that purpose, pre-amplifier 140 is provided an AGC terminal P1 so that its gain is controlled to an optimum degree to not worsen the non-linear distortion below the acceptable level.

In the cascade amplifier of pre-amplifier 140, the grounded-emitter configuration amplifier composed of transistor Q1 is further provided an impedance circuit, such as is well-known. The impedance circuit is comprised of a DC impedance circuit and an AC impedance circuit respectively for establishing prescribed DC and AC emitter biases for the emitter of transistor Q1. The DC impedance circuit comprises resistors R51 and R52 connected in series between the emitter of transistor Q1 and the ground potential circuit, while the AC impedance circuit comprises capacitors C50, C60 and C70 connected in series between the emitter of transistor Q1 and the ground potential circuit. In addition, the AC impedance circuit is provided a diode, for example, a PIN diode D50, connected in series between capacitors C60 and C70 at a forward bias condition. Then the afore-mentioned AGC terminal P1 is connected to the anode of PIN diode D50.

The gain of the grounded-emitter configuration amplifier composed of transistor Q1 which composes the cascade amplifier is controlled in accordance with the emitter impedance. On the other hand, the capacitive impedance of PIN diode D50 is variable in accordance with the forward bias applied thereon. Therefore, PIN diode D50 can vary the emitter impedance in response to the AGC signal applied to AGC terminal P1 so that the AGC for pre-amplifier 140 is established. When the maximum AGC signal is applied to AGC terminal P1, it is assumed here that the gain reduction in pre-amplifier can not be achieved (GR=0 dB).

On the other hand, the gain reduction due to the AGC is carried out by decreasing the AGC signal so that the AC impedance on the emitter of transistor Q1 is increased. By the action of the AGC, the gain of pre-amplifier 140 is reduced to the optimum value and the signal distortion due to amplifier 140 is suppressed.

The AGC, in combination with the capacitive AC impedance circuit to the emitter of transistor Q1, is effective for suppressing the non-linear distortion which occurs in pre-amplifier 140 itself. Moreover, since the optimum gain adjustment is carried out at a stage prior to first mixer 140, which is composed of diodes D10, D20, D30 and D40 which are the non-linear characteristic elements, the deterioration of the NF expressed by Equation (5) can be controlled to not worsen below an acceptable level. Furthermore, the AGC for pre-amplifier 140 is effective for compensating in advance the conversion loss in the first mixer 400. Therefore, second-RF signal amplifier circuit 80 is able to amplify the prescribed second-RF signal to a level ensuring the C/N over a predetermined degree but without increasing the cross-modulation distortion over the acceptable degree.

The AGC for second-RF signal amplifier 80 will now be described in detail. The AGC is performed by applying the AGC signal to second gate G2 of FET Q3 in second-RF signal amplifier 80. The AGC signal alters the bias voltage of second gate G2 of FET Q3 so that the gain of second-RF signal amplifier 80 is controlled.

FET Q3 itself generates a small amount of third order distortion so that the cross-modulation distortion can be made smaller in second mixer 110. As expressed in Equation (5), from the viewpoint of prevention of deterioration of the NF, it is desirable that the second stage amplifier perform a greater gain reduction compared to the first stage amplifier. In this sense, the gain reduction (GR) of second-RF amplifier 80 is made greater than the gain reduction of pre-amplifier 140.

The non-linear distortion in an amplifier as given by Equation (1) will now be investigated in detail. As described before, the third order distortions in the non-linear distortions become problems in practical use. In the third order distortion, there are included the cross-modulation distortion with a frequency the same as the frequency of the input signal and a beat with a frequency different from the frequency of the input signal. In the second order distortion, it includes the beat but does not include the cross-modulation distortion with the frequency of the input signal.

If there the cross-modulation distortion occurs, the desired channel signal is modulated by signals in other channels, so that the quality of the reproduced picture on television receivers will be seriously deteriorated. If the beat occurs, so-called beat stripes appear on the television receivers, so that the reproduced picture will be also seriously deteriorated.

In the embodiment shown in FIG. 1, the control of the gain reduction is carried out on both amplifier 140 and amplifier 80 by the same AGC signal. Therefore, the frequency converter is protected from the deterioration of the NF and the C/N and also from the disturbances of beat and cross-modulation distortion.

Figure 2:
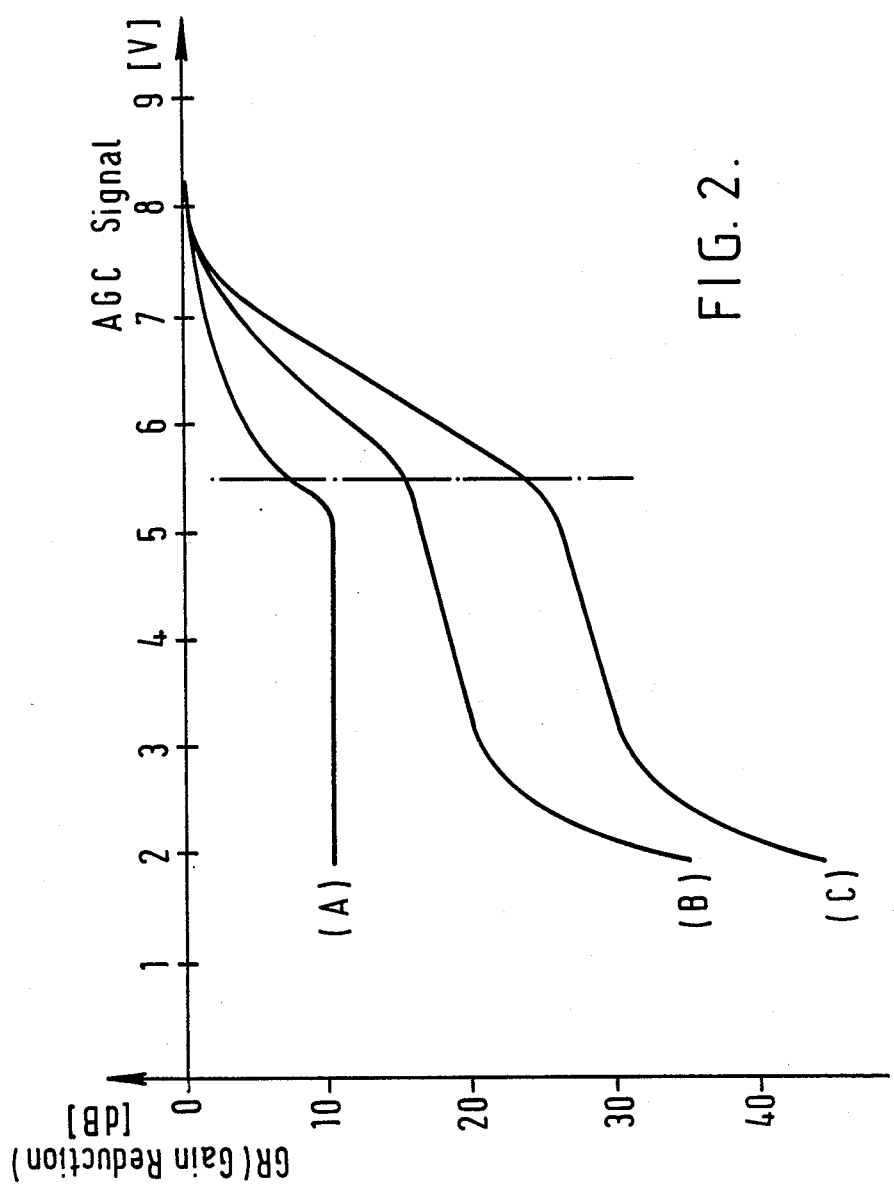
FIG. 2 is a graph illustrating the GR to AGC voltage characteristics.

FIG. 2 shows the gain reduction control characteristics for the AGC signal in the embodiment of FIG. 1. In FIG. 2, graph A shows the GR characteristic at pre-amplifier 140, graph B shows the GR characteristic at second-RF signal amplifier 80 and graph C shows the total GR characteristic of the frequency converter. As is clear from FIG. 2, a perticular state that the GR=0 (dB) corresponds to the AGC signal of about 9 (V). And as the AGC signal reduces, the GR graphs A, B and C increase. As is also clear from FIG. 2, the GR graph A for pre-amplifier 140 is less than the GR graph B for second-RF signal amplifier 80. The relation of the graphs A and B serves to simultaneously prevent the deterioration of the NF and the C/N and the disturbances from the beat and the cross-modulation distortion. That is, it is desirable to carry out gain reduction in the rear stage second-RF signal amplifier 80 rather than to reduce the gain as much as possible in the front stage pre-amplifier 140, in order to amplify the input signal without causing the deterioration of the NF and the C/N. On the other hand, the gain of pre-amplifier 140 is determined by taking into account the optimum signal level required for the advance compensation of the conversion loss in the frequency conversion at first mixer 400 without increasing the non-linear distortion over the acceptable degree.

In second-RF signal amplifier 80, the deterioration of the NF and the C/N are less even though the GR is made greater. Therefore, the GR of second-RF signal amplifier 80 is controlled to the optimum for minimizing the distortions due to the frequency conversion in the rear stage second mixer 110. In this case, the GR is controlled to a degree which does not fall below the level required in the rear stage circuit (e.g., amplifier 114 in the television receiver outside the frequency converter) in accordance with Equation (4) in order not to suppress the deterioration of the C/N of the whole frequency converter. This type of optimum GR value control characteristic for the frequency converter as a whole is shown by graph C in FIG. 2.

Figure 3:
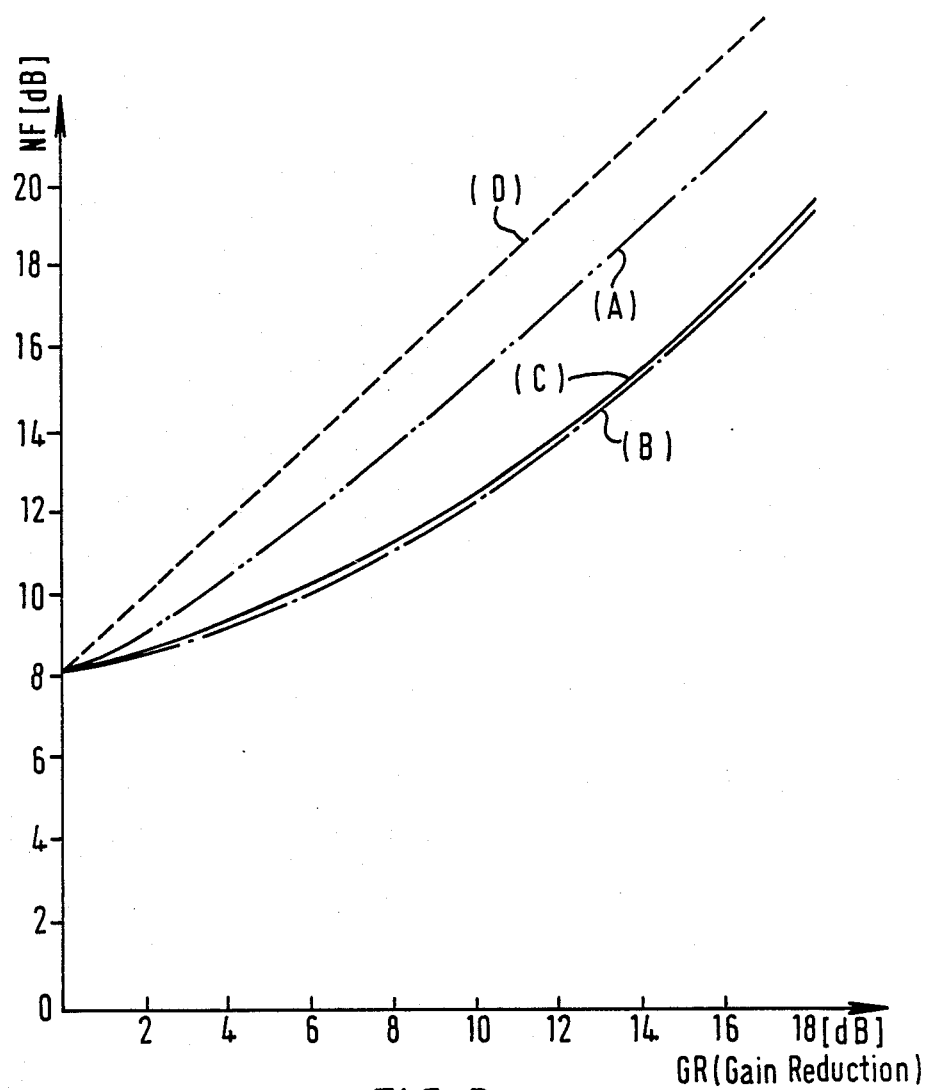
FIG. 3 is a graph illustrating the NF to GR characteristics.

FIG. 3 is a characteristic diagram showing relationships of the noise figure NF to the gain reduction GR of the embodiment of FIG. 1. Graphs A, B and C in FIG. 3 also designate the characteristics of pre-amplifier 140, second-RF amplifier 400 and the whole circuit of the frequency converter in similar to FIG. 2. For example, graph A in FIG. 3 shows the relationship between the GR and the NF in pre-amplifier 140, while graph D in FIG. 3 shows the relationship of the noise figure NF to the gain reduction GR of the conventional frequency converter.

As seen from FIG. 3, although the NF of pre-amplifier 140 would be deteriorated by an excessive gain reduction, the GR may be increased to a degree at which the signal distortion in pre-amplifier 140 does not exceed an acceptable degree. Since the worsening of the NF will improve as the GR becomes greater, it is possible to increase the GR in a state in which the worsening of the NF will lessen. As seen from graph B which shows a relationship of the noise figure NF to the gain reduction GR of second-RF signal amplifier 80, the NF in second-RF signal amplifier 80 is suppressed better than the NF in amplifier 140. This means that the greater gain reduction in second mixer 110 rather than pre-amplifier 140 makes it possible to carry out gain reduction in second-RF amplifier 80 at less NF compared with the pre-amplifier 140.

Graph C in FIG. 3 shows the relationship of the noise figure NF to the gain reduction GR of the frequency converter as a whole. As seen from graph C, the NF characteristic of the frequency converter is slightly inferior in compared with the NF characteristic for second-RF signal amplifier circuit 80 due to the signal feedback by the AGC. However, a greater improvement of the distortion characteristic can be achieved by the AGC.

Figure 4:
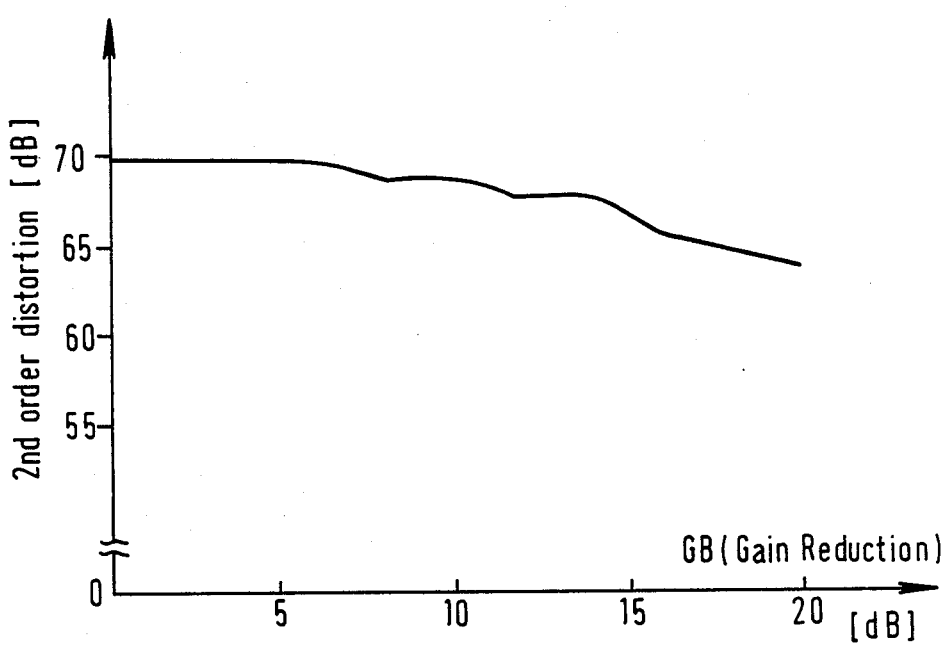
FIG. 4 is a graph illustrating the second order distortion to GR characteristic.

The non-linear distortion characteristic of the frequency converter will now be investigated in detail. There is the second order distortion which causes the beat, as mentioned above, in the non-linear distortion. The second order distortion is caused mainly by the use of the diode element in the frequency conversion stage such as first mixer 400 and second mixer 110. The relationship between the second order distortion and the gain reduction GR due to AGC is shown in FIG. 4. As shown in FIG. 4, the second order distortion fails to be severely deteriorated even when the GR is increased. When the GR is zero, the second order distortion is about 70 dB. And the NF is improved with the increase of the GR according to the AGC. The amount of the GR by AGC is made to vary in the range of about 0 dB to 25 dB in the embodiment of FIG. 1.

The cross-modulation distortion characteristic of the embodiment of FIG. 1 which occurs due to the third order distortion will now be investigated in detail. As seen from FIG. 5, which shows the relationship between the gain reduction due to AGC and the cross-modulation distortion, the cross-modulation distortion is suppressed to about 80 dB at the worst, no matter what the amount of GR.

Figure 5:
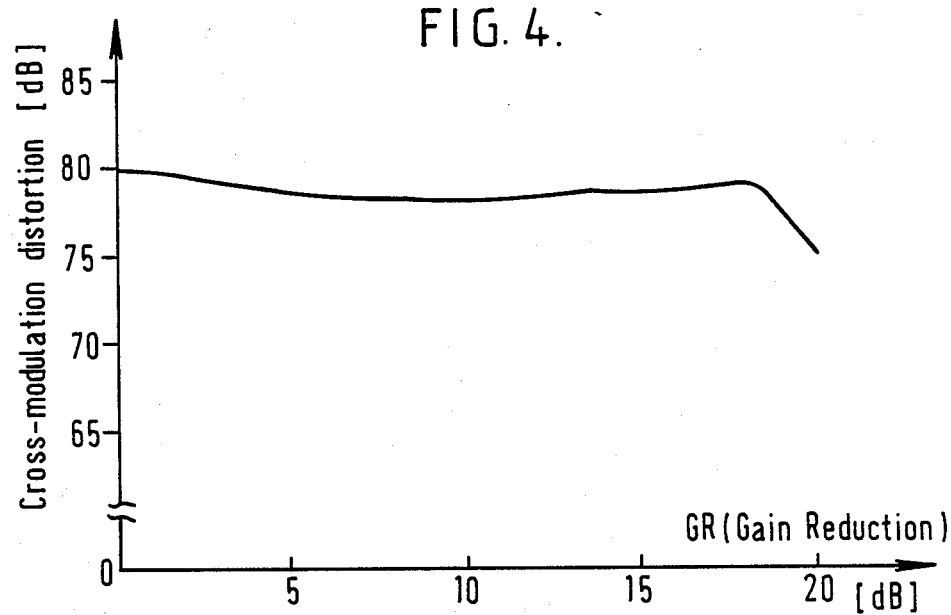
FIG. 5 is a graph illustrating the cross-modulation distortion to GR characteristic.
Figure 6:
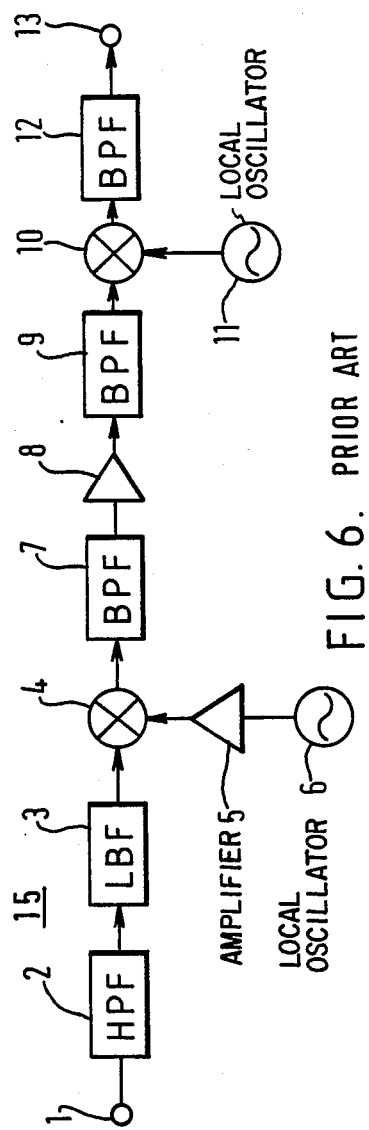
FIGS. 6 and 7 are circuit diagrams showing conventional circuits.
Figure 7:
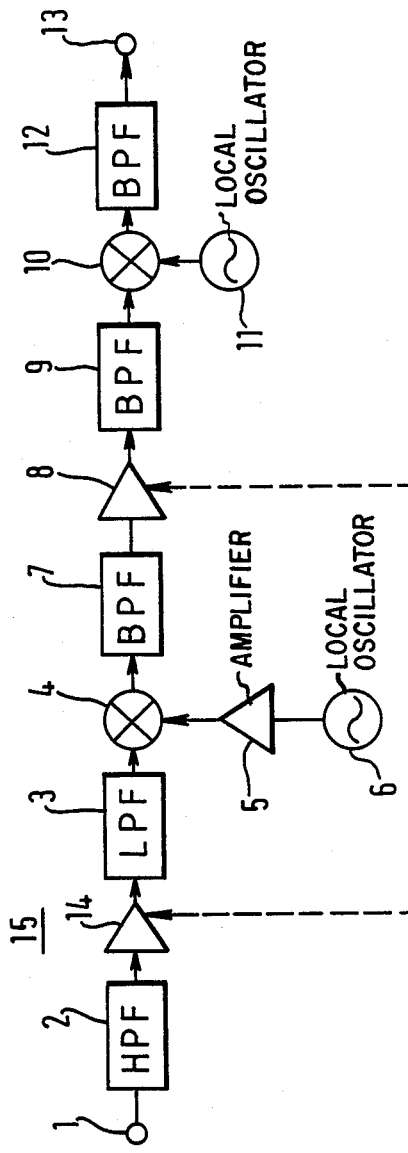

Further as seen from FIGS. 3, 4 and 5, the frequency conversion operation and the signal amplification operation in the frequency converter of the present invention are carried out without inviting severe deteriorations for the various inconsistent characteristics such as the characteristic of the NF, the C/N etc. and the characteristic of the signal distortion.

Moreover, since the gains of pre-amplifier 140 and second-RF signal amplifier 80 in the frequency converter system are simultaneously controlled at the optimum values in reference to both the noise figure NF and signal distortion, the problems of signal distortion and of the noise figure NF due to the frequency conversion operation can be prevented.

As described above, the frequency converter according to the present invention is able to suppress signal distortions, such as the second and third order distortions, and simulteneously able to improve the carrier to noise ratio C/N. Therefore, the present invention is able to provide a frequency converter suitable for receiving multi-channel broadcasts such as CATV broadcasts.

Moreover, the frequency converter according to the present invention is able to suppress the cross-modulation distortion and the beat occurring in the frequency conversion, and is simulteneously able to prevent the deterioration of the desired signal wave or the characteristic of the carrier to noise ratio etc.

Also, the present invention is not limited for frequency converters used for the reception of CATV signals, which are multi-channel broadcasts, but it can also be applied to frequency converters for the reception of other signals, including the reception of general television signals. Furthermore, the present invention is not limited for up-down frequency converters but may also be applied to general frequency converters employing a front stage amplifier and a rear stage amplifier such as down converters or up converters. Further the front stage amplifier in the frequency converter is not limited to the cascade configulation amplifier.

What is claimed is:

1. A frequency converter comprising:
   an input terminal for receiving a broadcast signal with a first frequency;
   a first variable gain amplifier for amplifying said broadcast signal applied from said input terminal comprising a first transistor connected in a grounded emitter configuration and a second transistor connected in a grounded base configuration;
   a local oscillator for generating a local oscillation signal;
   a frequency mixer circuit for converting said first frequency of said broadcast signal applied from said first variable gain amplifier to a second frequency using said local oscillation signal output from said local oscillator;
   a second variable gain amplifier for amplifying a signal with said second frequency applied from said frequency mixer circuit; and
   an AGC circuit means for feeding back to said first and second variable gain amplifiers an AGC signal which is obtained from a signal output from said second variable gain amplifier wherein said AGC signal serves to simultaneously adjust the gain of said first variable gain amplifier by a first amount for a given value of said AGC signal and adjust the gain of said second variable gain amplifier by a second amount, greater than said first amount, for said given value of said AGC signal.

2. A frequency converter according to claim 1, further comprising:
   a second local oscillator for generating a second local oscillation signal; and
   a second frequency mixer circuit for converting said second frequency of said signal applied from said second variable gain amplifier to a third frequency using said second local oscillation signal output from said second local oscillator.

3. A frequency converter according to claim 2, wherein the frequency of said oscillation signal of said first local oscillator is variable and the frequency of said second oscillation signal of said second local oscillator is fixed.

4. A frequency converter according to claim 3, wherein said first frequency mixer circuit converts said first frequency which is to said second frequency higher than said first frequency and said second frequency mixer circuit converts said second frequency which is to said third frequency lower than said second frequency.

5. A frequency converter according to claim 1, wherein said second variable gain amplifier carries out a gain reduction greater than said first variable gain amplifier in response to said AGC signal.

6. A frequency converter according to claim 1, wherein said grounded-emitter configuration amplifier is provided with a diode in an emitter impedance circuit of said first transistor and wherein said AGC signal is applied to said diode.

7. A frequency converter according to claim 6, wherein said diode is a PIN diode.

8. A frequency converter according to claim 7, wherein said second variable gain amplifier is comprised of an FET and said AGC signal is applied to a second gate of said FET.

9. A frequency converter comprising:
   an input terminal for receiving a broadcast signal with a first frequency;
   a first variable gain amplifier for amplifying said broadcast signal applied from said input terminal;
   a local oscillator for generating a local oscillation signal;
   a frequency mixer circuit for converting said first frequency of said broadcast signal applied from said first variable gain amplifier to a second frequency using said local oscillation signal output from said local oscillator;

a second variable gain amplifier for amplifying a signal with said second frequency applied from said frequency mixer circuit; and an AGC circuit means for feeding back to said first and second variable gain amplifiers an AGC signal which is obtained from a signal output from said second variable gain amplifier, wherein said AGC signal serves to simultaneously adjust the gain of said first variable gain amplifier by a first amount for a given value of said AGC signal and adjust the gain of said second variable gain amplifier by a second amount, greater than said first amount, for said given value of said AGC signal.

10. A frequency converter of claim 9 wherein said first variable gain amplifier comprises:

first and second transistors each with a base, an emitter and a collector;

a variable impedance connected to receive said AGC signal, wherein the value of said variable impedance is controlled by said AGC signal;

said emitter of said first transistor being connected to said variable impedance;

said base of said first transistor being connected to receive said broadcast signal;

said collector of said first transistor being connected to the emitter of said second transistor;

said base of said second transistor being connected to a ground potential; and said collector of said second transistor being connected to said frequency mixer circuit, wherein the gain imparted by said first variable gain amplifier to said broadcast signal is controlled by the value of said variable impedance.

11. The frequency converter of claim 10 wherein said variable impedance is a PIN diode.

12. A gain control circuit which receives an input signal and an AGC signal and produces an output signal comprising:

first and second transistors each with a base, an emitter and a collector;

a variable impedance connected to receive said AGC signal, wherein the value of said variable impedance is controlled by said AGC signal;

said emitter of said first transistor being connected to said variable impedance;

said base of said first transistor being connected to receive said input signal;

said collector of said first transistor being connected to the emitter of said second transistor;

said base of said second transistor being connected to a ground potential; and said collector of said second transistor providing said output signal, wherein the gain imparted by said gain control circuit to said input signal is controlled by the value of said variable impedance.

13. The gain control circuit of claim 12 wherein said variable impedance is a PIN diode.

14. A frequency converter comprising:

an input terminal for receiving a broadcast signal with the first frequency;

a first variable amplifier gain for amplifying said broadcast signal applied from said input terminal;

a local oscillator for generating a local oscillation signal;

a frequency mixer circuit for converting said first frequency of said broadcast signal applied from said first variable gain amplifier to a second frequency using said local oscillation signal output from said local oscillator;

a second variable gain amplifier for amplifying a signal with said second frequency applied from said frequency mixer circuit; and an AGC circuit means for feeding back to said first and second variable gain amplifiers an AGC signal which is obtained from a signal output from said second variable gain amplifier, wherein said first variable gain amplifier comprises:

first and second transistors each with a base, an emitter and a collector, a variable impedance connected to receive said AGC signal, wherein the value of said variable impedance is controlled by said AGC signal, said emitter of said first transistor being connected to said variable impedance, said base of said transistor being connected to receive said broadcast signal, said collector of said first transistor being connected to the emitter of second transistor, the base of said second transistor being connected to a ground potential, and the collector of said second transistor being connected to said local oscillator.

15. The frequency converter of claim 14 wherein said the variable impedance is a PIN diode.

16. A frequency converter comprising:

an input terminal for receiving a broadcast signal with a first frequency;

a first variable gain amplifier for amplifying said broadcast signal applied from said input terminal comprising a first transistor connected in a grounded emitter configuration and a second transistor connected in a grounded base configuration;

a local oscillator for generating a local oscillation signal;

a frequency mixer circuit for converting said first frequency of said broadcast signal applied from said first variable gain amplifier to a second frequency using said local oscillation signal output from said local oscillator;

a second variable gain amplifier for amplifying a signal with said second frequency applied from said frequency mixer circuit; and an AGC circuit means for feeding back to said first and second variable gain amplifiers a same AGC signal which is obtained from a signal output from said second variable gain amplifier wherein said same AGC signal serves to simultaneously adjust the gain of said first variable gain amplifier by a first amount for a given value of said AGC signal and adjust the gain of said second variable gain amplifier by a second amount, greater than said first amount, for said given value of said AGC signal.

* * * * *